United States Patent [19]
Szirmai et al.

[11] Patent Number: 4,701,941
[45] Date of Patent: Oct. 20, 1987

[54] RADIATION SOURCE

[75] Inventors: Stephen G. Szirmai, Northbridge; Gerard R. Newman, Gordon; Philip L. Kelly, North Manly, all of Australia

[73] Assignees: Commonwealth Scientific and Industrial Research Organization (CSIRO); Unisearch Limited, both of Australia

[21] Appl. No.: 666,083
[22] PCT Filed: Feb. 7, 1984
[86] PCT No.: PCT/AU84/00020
§ 371 Date: Oct. 1, 1984
§ 102(e) Date: Oct. 1, 1984
[87] PCT Pub. No.: WO84/03175
PCT Pub. Date: Aug. 16, 1984

[30] Foreign Application Priority Data
Feb. 8, 1983 [AU] Australia ............... PF7934

[51] Int. Cl.$^4$ ............................................. H01J 35/16
[52] U.S. Cl. .................................... 378/122; 378/119; 378/121
[58] Field of Search ............ 378/122, 119, 121; 118/716

[56] References Cited
FOREIGN PATENT DOCUMENTS
2919902 11/1979 Fed. Rep. of Germany ...... 118/716
0053529 5/1978 Japan ................................ 118/716

Primary Examiner—Carolyn E. Fields
Assistant Examiner—David P. Porta
Attorney, Agent, or Firm—Sughrue, Mion, Zinn, Macpeak and Seas

[57] ABSTRACT

The generation of X-radiation occurs when a powder (14,24,38,47,58) is subjected to electro-dispersion in an evacuated chamber. The powder is of a conducting or semiconducting material, and is supported on the lower of two electrodes (10,11; 22,25; 36,39; 44,48; 52,56) in the chamber. When the chamber pressure is about $10^{-5}$ Torr or lower, and a high voltage is applied across the electrodes, part of the powder forms a dispersed particulate cloud in the space between the electrodes. The dispersion of the powder results in the generation of X-radiation which is transmitted through the wall (13) of the chamber or through a window (28,35,45) in the apparatus. Visible light is produced if a phosphor (29) is included in the chamber, and is irradiated by X-rays generated upon dispersion of the powder, or if the powder includes particles of a phosphor.

25 Claims, 5 Drawing Figures

TO
VACUUM PUMP

RADIATION SOURCE

TECHNICAL FIELD

This invention concerns the generation of radiation. In this specification, radiation includes photons (such as X-rays and light) and electrons. In a particularly useful application, the present invention provides novel apparatus for generating X-rays.

BACKGROUND ART

X-ray sources in most common use are of two kinds, namely radioisotope sources and X-ray tubes.

Radioisotope X-ray sources consist of small encapsulated quantities of radioactive materials which emit X-rays and/or low-energy gamma radiation. Some radioisotope X-ray sources also emit higher-energy radiation. The quantities of radioactive materials used range from fractions of a microgram to several grams. Such sources are of simple construction, compact and do not require external power supplies for their operation. Their output of radiation is highly stable, but decays over a period of time at known rates, according to the half-life of the active isotope. The encapsulation is generally sufficient to ensure that the source is safe under normal conditions of use in the laboratory and in industry.

The isotope used in radioisotope X-ray sources is selected from about 12 radioisotopes which emit X-radiation and/or low-energy gamma radiation substantially free from higher-energy gamma radiation. Hence the choice of radiation energies for such sources is limited. The output of radiation is determined by the mass in the source and the activity per unit mass of the encapsulated material. However, in practice, both of these quantities have upper limits, so that the maximum available output from a radioactive source is also limited.

Radioisotope X-ray sources are generally costly, and are produced by only a few manufacturers.

An X-ray tube is essentially an evacuated enclosure which contains a source of electrons (or cathode) and a target (or anode). The target emits X-rays when it is bombarded by electrons as a result of the voltage difference applied between the source of electrons and the target. The electrons are usually generated by thermionic emission, the cathode being an incandescent filament. However, cold cathodes (also termed "field-emission cathodes") are used for those applications where a low electron current is acceptable or where one or a few brief bursls of high electron current are sufficient (such as in flash X-ray tubes).

The output of radiation from an X-ray tube is determined by factors such as the electron current, the voltage difference between the cathode and the anode, and the atomic number of the material of the target. The energy spectrum of the emitted radiation is also controlled by these factors. In general, the output of an X-ray tube is much higher than the outputs that are available from radioisotope sources (up to several orders of magnitude greater), and the energy spectrum of the emitted radiation can be controlled within wide limits.

However, X-ray tubes are usually bulky pieces of apparatus and even the smallest tubes have a diameter of from 50 to 100 mm and a length of about 200 mm. They require an external power supply and must be cooled to remove the heat generated by the filament and the target.

Another problem associated with X-ray tubes is that they frequently fail after relatively brief periods of use due to some heat-induced cause, such as gas-evolution from the target or evaporation or burn-out of the filament material. Cold cathode X-ray tubes are not prone to thermal damage, but they often exhibit rapid drops in output due to blunting of, erosion of, or other changes to the pointed ends of their field-emitting cathode.

DISCLOSURE OF THE PRESENT INVENTION

It is one objective of the present invention to provide a reliable and robust radiation source, with a stable output over a long period of time, which is able to be constructed at relatively low cost.

This objective is achieved by making use of a hitherto unsuspected property of powder dispersions of the type that is sometimes used for the deposition of metal vapours on particulate substrates. Examples of such dispersions have been described in the specification of Australian Patent Application No. 69790/81. They are established by positioning a power on a generally flat and horizontally mounted anode in a vacuum chamber, and applying a high voltage between the anode and a cathode, also in the vacuum chamber, mounted above it. The powder is promptly put into suspension between the anode and the cathode. To coat such suspended particles, high temperature vapours are generated within the vacuum chamber, typically by heating by electron bombardment.

In experimental work on metal coating of powders, the present inventors discovered that, unexpectedly, X-rays were occasionally detected near the equipment being used when the coating was being applied to the powders. Although powder dispersion techniques are known, there has been no disclosure in the scientific literature of the observation of the emission of X-rays or other radiation from the dispersed powders. The present inventors subsequently established that generation of high temperature vapours was not a pre-requisite for the generation of X-rays or other radiation; the radiation was emitted when the powder was dispersed between the electrodes provided the pressure at which the dispersion occurs is sufficiently low. This led to the realisation that this sort of equipment—without the generation of high temperature vapours—could form the basis for a practical source of radiation.

Thus, according to one aspect of the present invention, a radiation source comprises:

(a) at least two electrodes mounted in an evacuable chamber with one of the electrodes positioned above the other electrode;

(b) a quantity of a powder of at least one conducting or semiconducting material supported on the lower of the electrodes when the potential difference between the electrodes is less than the value of potential difference which produces the minimum dispersing field for the powder; and (c) means permitting the transmission of radiation from the region between the electrodes to the outside of said chamber;

whereby, when said chamber is evacuated to a pressure of about $10^{-5}$ Torr or lower and said potential difference between the electrodes has a value which exceeds the value which produces the minimum dispersing field for the powder, at least some of said powder is dispersed between said electrodes and radiation is generated within said chamber, said radiation being transmitted through said means permitting the transmission of radiation.

The lower of the two electrodes has usually been the anode when dispersions of particulate material have been generated in the past, but the present invention does not require the lower electrode to be the anode.

The lower electrode may have a substantially planar upper surface, or it may be dished to provide a shallow concave surface.

The surface of the upper electrode which faces the lower electrode may be of any suitable shape. For example, it may be a planar surface or a surface containing a plurality of pointed projections.

For some applications of the present invention, the electrodes will both be mounted within a cylinder, at least part of which is radiation-transparent, and they will extend across substantially the entire cylinder, so that the cylinder acts to constrain lateral movement of a powder that has been dispersed within the chamber.

Given the basic concept of the new radiation source, and the theoretical explanation of its operation (which is provided later in this specification), it becomes possible to produce specific sources of desirable radiation, as follows:

(a) Bremsstrahlung sources (sources of "white" radiation)—by ensuring that either the voltage across the electrodes is insufficient to produce the characteristic X-rays of the powder material, or the powder composition is such that only characteristic X-rays having low energy, which are not transmitted by the source enclosure, are produced.

(b) Characteristic X-ray sources—by ensuring that the voltage difference between the electrodes is sufficient to produce the characteristic X-rays of the powder material in addition to Bremsstrahlung.

(c) Sources of light—by allowing the generated X-rays to irradiate a phosphor, such as zinc sulphide, which is inside or outside the vacuum chamber, or by including particulate "cathodoluminescent" phosphors in the powder that forms the cloud between the electrodes.

(d) Electron Sources—by providing for interactions between emitted electrons and dispersed powder particles, other than interactions which result only in X-radiation and/or light. They may include interactions which result in modifications of certain properties of the powder material.

These and other apects of the present invention will become more apparent from the following description of embodiments of the present invention, in which reference will be made to the accompanying drawings.

DESCRIPTION OF THE ILLUSTRATED EMBODIMENTS

Figure 1:
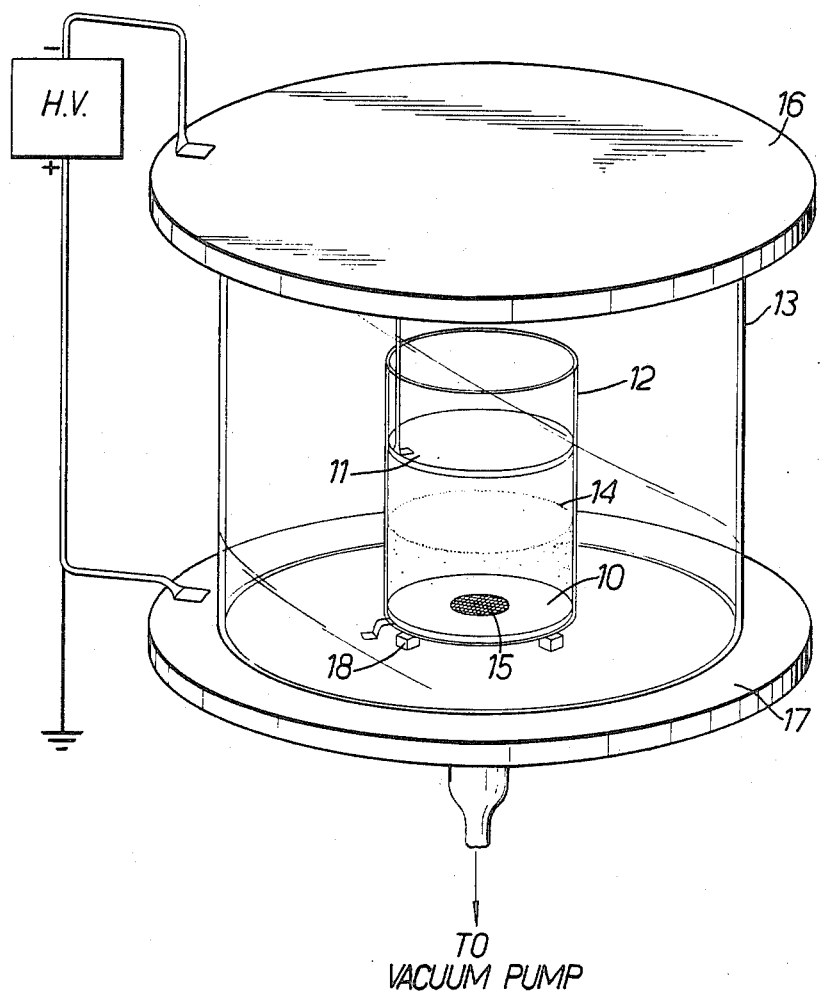
FIG. 1 is a diagram of an experimental X-ray source that has been used to demonstrate the present invention.

The apparatus illustrated (partly schematically) in FIG. 1 was designed primarily for use in powder coating experiments, but it has been used to demonstrate the present invention. It comprises a pair of electrodes 10,11 supported within a silica glass tube 12. The electrodes and the glass tube are encased within a glass enclosure 13. A vacuum pumping system is connected to the glass enclosure 13 and maintains a pressure of about $10^{-5}$ Torr or lower within the enclosure 13 by continuous pumping with a vacuum pump. Each electrode 10,11 is a circular aluminium disc of about 80 mm diameter. These electrodes are mounted one above the other, with their opposed faces parallel. The lower disc (10) fits tightly within the tube 12 and is used to support a bed of powder 14 (typically 100 gm of nickel particles having a mean diameter of about 100 micrometers) with a clearance of at least 25 mm between the upper surface of the powder and the lower surface of the upper electrode 11. The lower electrode 10 includes a fine stainless-steel mesh 15 to enable evacuation of the region in tube 12 below electrode 11. The tube 12 is mounted on four small blocks 18 to ensure that the entire inside of the glass enclosure 13 can be evacuated by the vacuum pump. The mesh 15 is sufficiently fine that the powder particles 14 do not pass through it.

The glass enclosure 13 has a circular horizontal cross-section of diameter about 300 mm, and is closed at each end by a metal plate. The lower metal plate 17, to which the electrode 10 is connected, is usually earthed. When a voltage of $-25$ kV is then applied to the upper plate 16, to which the electrode 11 is connected, a vigorous electrostatic dispersion or cloud of some of the particles of the powder 14 is formed between the anode 10 and the electrode 11, above the remainder of the powder which continues to be supported on the lower electrode 10.

In addition to causing the dispersion of powder particles between electrodes 10 and 11, the application of high voltage difference across the plates 16, 17 results in the generation of X-radiation from the cloud of dispersed particles. The X-radiation is sufficiently intense to be detected after passage through the walls of tube 12 and enclosure 13—a combined thickness of 10 mm.

From the measurements made of the X-radiation that has been observed, and allowing for the attenuation due to the silica glass and glass walls, an estimate has been made of the intensity of X-radiation within the enclosure 13. For convenience, this intensity has been expressed in terms of an "equivalent activity", being the activity in Curies of a point source of a radioisotope emitting radiation of the same energy as the mean energy of the measured radiation from the "powder source" within tube 12. The "powder source" was conservatively estimated to have an equivalent activity in the range from 40 to 60 Curies, with emission of X-radiation at a rate of from 5.5 to 8.2 Curies per watt of input power.

As indicated above, this estimate was an underestimate because, due to the nature of the glass used for enclosures 12 and 13, no radiation below about 20 keV was measurable. Thus the contribution of X-radiation having energy less than 20 keV, which was effectively absorbed by the glass of enclosures 12 and 13, was ignored when estimating the X-radiation output of the "powder source". Those skilled in this art will recognise that this means that most of the bremsstrahlung contribution, which has a peak at about two-thirds of the voltage applied to the plates 16 and 17, has been ignored, and that the nickel K-alpha X-rays of about 7.5 keV have also been ignored. Those skilled in this art will also be aware that small standard X-ray tubes of the type described in the "EG-series beryllium window X-ray tubes technical data", published by Machlett Labs, Inc in 1974, which have a tungsten filament and target, can normally generate up to about 17 Curies of X-radiation per watt of input power, which is comparable to the output of miniature X-ray tubes having a tungsten filament and copper target, such as those described in the paper by J. M. Jaklevie et al. in *Advances in X-Ray Analysis*, Volume 15, page 266, 1972, entitled "Small X-Ray Tubes for Energy-Dispersive Analysis". Field emission X-ray tubes having a single, needle-type cathode, such as those described by J. H. McCreary et al. in *Advances in X-Ray Analysis*, Volume 15, page 285, 1972, in the paper entitled "The Use of Field-Emission Tubes in X-Ray Analysis", have a maximum equivalent output of about 6 Curies, produced at the rate of about 8 Curies per watt of input power.

Thus the apparatus of FIG. 1 is potentially a very useful source of X-radiation, provided that the enclosure 13 is effectively screened to prevent uncontrolled emission of radiation, and at least one window is provided, through which radiation generated within tube 12 may pass.

The present inventors have put forward a theoretical explanation of the emission of X-radiation from a dispersed powder. In a simplified form, the mechanism that has been proposed to explain the emission of X-radiation from electrostatically dispersed or levitated powder particles is as follows.

On applying a sufficiently high voltage gradient between the anode 10 and the cathode 11, electro-dispersion is generated as particles leave the powder bed and move towards the cathode 11, where they are discharged on impact and their sign is reversed. These negatively charged particles then return to the remaining undispersed portion of the bed located at the anode 10 where they are discharged and given a positive charge. If the cathode 11 is held at a sufficiently high voltage, the positively-charged particles which are close to it set up voltage gradients which are high enough to cause, prior to the collision of the particles with the cathode, the field-emission of electrons from the regions of the cathode which are approached by the positively charged particles.

Some of the emitted electrons interact with particles in the cloud to produce bremsstrahlung or—if the cathode voltage is appropriate—both bremsstrahlung and the characteristic X-rays of the particle material. Other emitted electrons are scattered by particles in the cloud, some of these electrons undergoing various interactions, others escaping from the cloud.

Positive ions may also be liberated from particles which approach and/or bombard the cathode to cause the emission of X-rays, and such positive ions may also interact with particles in the dispersed powder cloud.

All interactions with powder particles generate heat, thus increasing the temperature of the dispersed particles. However, the heated particles give up most of the generated heat to the cathode and to the bulk of powder particles on anode 10 when they return to the bulk powder after colliding with the cathode.

At any time during the application of the high voltage across plates 16 and 17 (and hence across electrodes 11 and 10), many powder particles are close to the cathode 11. Consequently, many voltage gradients are established, so that the electrode 11 acts as if it were many field-emitting cathodes in parallel.

The radiation photons produced within the cloud of dispersed particles are emitted substantially uniformly in all directions. This means that many of the photons experience one or several successive collisions with particles in the cloud, losing energy and changing direction after each collision, whilst some photons escape from the cloud without having collided. The cloud is thus a particular case of a self-absorbing photon source.

Of the photons escaping from the cloud, some will collide as above with atoms constituting the tube 12, the latter acting as an attenuator. The photons transmitted through tube 12 will next collide as above with atoms constituting enclosure 13 or else be transmitted through enclosure 13. Thus enclosure 13 acts as a further attenuator.

One combined effect of self-absorption and of attenuation by tube 12 and enclosure 13 is a reduction of the intensity of the radiation that has been produced within the particle cloud. The extent of this reduction of intensity will depend on the original photon energy, the composition and bulk density of the cloud and the compositions and thicknesses of tube 12 and enclosure 13.

The theoretical explanation for the emission of X-radiation when the upper electrode 11 is the anode and the lower electrode 10 is the cathode is similar to, but a modification of, the explanation that has been given above. If the lower electrode has a negative potential relative to the upper electrode, the particles 14, which become the particulate cloud, are negatively charged. These particles, when in the cloud, move towards the upper electrode and collide with it, thus losing their negative charge and acquiring a positive charge. They then move back to the bulk of the powder on the lower electrode for a further charge reversal, before again becoming part of the particulate cloud. If the upper electrode 11 is held at a sufficiently high positive voltage, the negatively charged particles that approach it set up voltage gradients which are high enough to cause the field emission of electrons from the particles, prior to collision. Some of these emitted electrons interact with the upper electrode 11 to generate radiation, at least some of which escapes from the tube 12 and enclosure 13.

Experiments with the upper electrode 11 as the anode have shown that there is a significant increase in current through the device which indicates that there is a corresponding increase in the intensity of the X-radiation with this arrangement of electrodes. Any such increase in the observed X-radiation intensity may be due to a greater electron-emitting ability of small particles with strongly curved surfaces, than the relatively flat surface of the electron-emitting cathode when the lower electrode 10 is the anode.

To facilitate the operation of the radiation source of the present invention, and to control, modify or improve the desired output of the source, a number of approaches, taken singly or in various combinations, are possible. These include:

(a) constructing the source of radiation as a permanently sealed unit;

(b) constructing the source of radiation as a demountable assembly, to enable the powder and/or the electrodes to be changed, if necessary;

(c) the provision of one or more radiation windows at locations selected to ensure maximum transmission of the generated radiation (including, if appropriate, a window in one or each electrode);

(d) the provision of one or more thin radiation windows, the properties of each window being adapted to control the intensity and/or the energy of the radiation that is transmitted through the window;

(e) the provision of an extended elongate window substantially horizontally around the outer glass enclosure, to permit the horizontal emission of radiation in substantially all directions from the powder source;

(f) modification of the shape, size, surface composition and/or other surface properties of the upper electrode to control the electron currents emitted by the cathode or the particles approaching the anode, as the case may be;

(g) the incorporation of means to heat the upper electrode when it is the cathode to augment field emission of electrons;

(h) adjusting the voltage difference between the anode and the cathode (including the application of an AC ripple on the DC high voltage) to effect controlled variations in the output of radiation;

(i) varying the composition and/or the particle sizes, shapes, bulk density and surface characteristics of the powder employed, in order to control the nature of the radiation emitted by the source when the upper electrode is the cathode;

(j) using a mixture of powders within tube 12, to extend the range of properties of the emitted radiation when the upper electrode is the cathode;

(k) providing materials which produce other forms of radiation when subjected to irradiation by X-rays or electrons, such as phosphors which produce light. (thereby providing either a visual indication of X-ray generation or light instead of or in addition to X-radiation);

(l) the provision of auxiliary electrodes or other means for controlling the path and motion of dispersed particles and/or electrons; and (m) varying the anode and cathode dimensions, and/or the materials of which the tube 12, enclosure 13, radiation window(s), powder particles and/or electrodes are constructed.

This list is not exhaustive.

Some of these modifications are illustrated in FIGS. 2, 3, 4 and 5.

Figure 2:
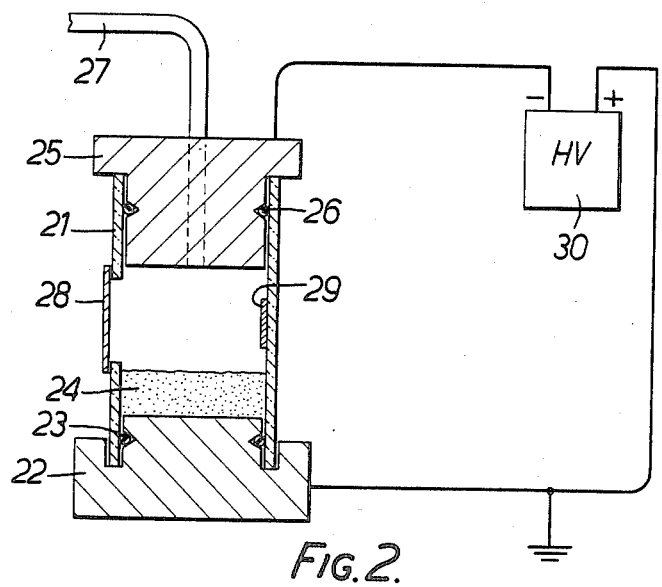
FIG. 2 is a sectional view of a demountable source of X-radiation and/or light, permitting the powder, cathode and/or radiation window to be changed.

The apparatus illustrated in FIG. 2 is an improved version of the apparatus of FIG. 1, which includes a window to allow more radiation to be emitted from the apparatus. It comprises an open-ended cylinder 21, which is rigid, electrically insulating and suitable to form part of the wanted evacuated enclosure. The cylinder 21 may conveniently be constructed of silica (for example, in the form of tubing). Cylinder 21 is fitted to an earthed metal base 22, a vacuum-tight joint being obtained by using O-ring 23 or a suitable cement or other seal. After introducing powder 24, the cylinder 21 is closed by a metal plug 25, which is fitted with (a) O-ring 26 to give a vacuum-tight seal and (b) side-arm 27 for connecting to a vacuum pump. Connecting plug 25 to the negative terminal of an earthed high voltage DC power supply 30 permits the lower face of plug 25 to act as a cathode.

To enable (and to increase) the transmission of X-radiation produced within cylinder 21 in a particle cloud below the cathode, the cylinder 21 is provided with a radiation window 28. Window 28 comprises an opening in the cylinder wall which has been covered by a thin foil of a material which is capable of withstanding the pressure drop after evacuation and which has excellent radiation transmission properties. One suitable foil is 0.25 mm thick beryllium metal foil. Typically, a radiation window is provided by cementing a 15 mm diameter piece of foil over a 10 mm diameter hole in cylinder 21, but other shapes and sizes are also feasible. (The cement must be able to provide a vacuumtight joint).

If loaded with a suitable cathodoluminescent powder which can be dispersed, the assembly shown in FIG. 2 acts as a light source and a radiation window is unnecessary it the cylinder 21 is made of a material which is transparent to light.

By affixing a phosphor 29 (such as activated zinc sulphide in a suitable physical form) inside cylinder 21, a visual indication of X-ray production is available, provided the cylinder is made of a material which is transparent to the light generated when the phosphor is irradiated.

Figure 3:
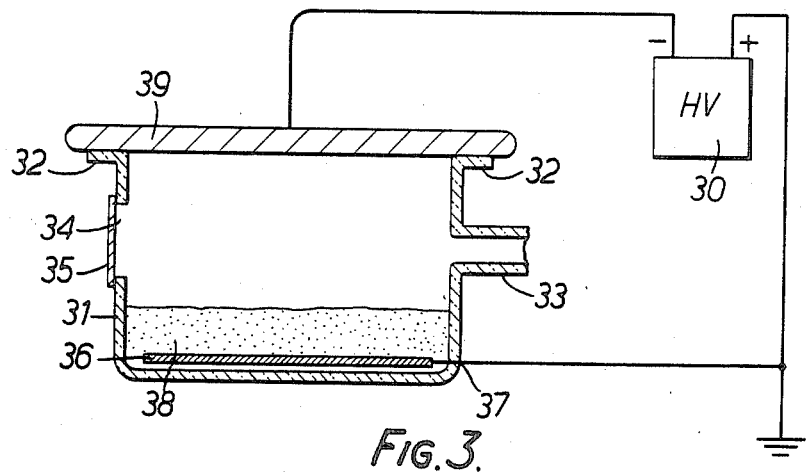
FIG. 3 is a sectional view of a source which facilitates powder and cathode changes.

The apparatus shown in FIG. 3 is a simplified version of the apparatus of FIG. 2, permitting rapid changing of the dispersible powder and the cathode. The radiation source consists of a glass container 31 of any desired shape, for example, a cylinder or a rectangular trough, closed at its lower side and provided with a flange 32 around its open upper side. The upper surface of flange 32 is a ground surface. Container 31 is provided with a side-arm 33 (for connection to a vacuum pump) and one or more openings 34. A radiation window 35 is cemented over the or each opening 34, as described above. A metal plate 36, located on the bottom of container 31 and covering its base, is connected to earth potential via a vacuum-tight feed-through 37.

The earthed electrode 36 may be replaced by a conducting film applied to the glass bottom of container 31 and connecting the conducting film to earth potential.

The container 31 will normally be charged with a quantity of dispersible powder 38 and closed by cathode 39. A good seal between the cathode 39 and the ground upper surface of flange 32 is obtained by grinding the surface of the cathode 39 which is adjacent to flange 32 and applying a suitable high-vacuum grease (such as Apiezon, Type T) to the abutting ground surfaces. This practice ensures that a vacuum-tight joint is created when a vacuum is applied via side-arm 33. The quantity and type of powder 38 is readily changed after relieving the vacuum by admitting air to container 31 via side-arm 33 and removing cathode 39. Cathodes of any material, and made to any design, can replace the original cathode 39, provided they do not obstruct opening(s) 34 and side-arm 33 and provided they have the ground surface which ensures that a vacuum-tight closure of container 31 is made.

Figure 4:
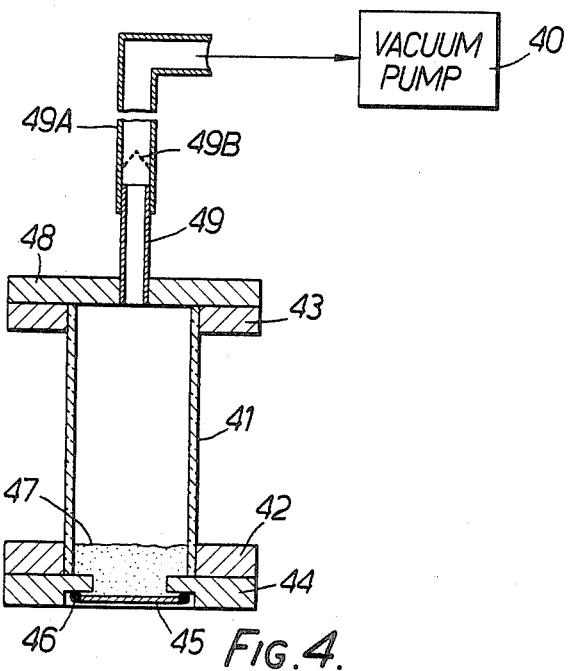
FIG. 4 depicts a modified form of the radiation source of FIG. 2.

The apparatus shown in FIG. 4 is a modified form of the radiation source of FIG. 2. One modification is the provision of a radiation window in one of the electrodes. The other modification is the provision of a tube which may be connected to a vacuum pump when the source is evacuated, and can then be pinch-sealed when the pumping has been completed.

The apparatus of FIG. 4 comprises an insulated cylinder 41 of fused alumina (but any other suitable ceramic material could be used instead of alumina) to which stainless steel "Contlat" (trade mark) vacuum flanges 42 and 43 have been brazed. The lower flange 42 is matched to a further flange 44 which supports a thin beryllium radiation window 45. The radiation window 45 is attached to the flange 44 by a vacuum-brazed, vacuum-tight circumferential joint 46. A powder 47 is introduced into cylinder 41 before a fourth flange 48 is bolted to flange 43 to form a vacuum-tight joint between flanges 43 and 48.

A length of oxygen-free copper tubing 49 is welded to flange 48 before the flanges 43 and 48 are bolted together, to provide a connection to the interior of the cylinder 41. After assembling the apparatus, the tubing 49 is connected to an oil-free vacuum pumping system 40, and the cylinder 41 is evacuated.

To facilitate the outgassing of the assembled apparatus, a voltage (typically in the range from 5 to 7.5 kv) which is high enough to cause dispersion of the powder, but does not produce significant internal discharges, may be applied across the flanges 44 and 48 and the assembly heated to about 300° C. Since dispersing the powder 47 can result in some of the powder entering tubing 49 and being conveyed to the vacuum pump, it is advisable, if the outgassing is to be facilitated in this manner, to interpose a short length of stainless steel tubing 49A, to which at least one internal, inclined baffle 49B has been fitted, between the tubing 49 and the vacuum pump 40. The baffles 49B permit gas flow through the tube 49A, but prevent the passage of any particles through it.

When the outgassing is complete, the tube 49 may be "pinch-scaled" near its junction with flange 48. Pinch-sealing creates a vacuum-tight cold weld, which enables the assembly to be removed from the vacuum pump and used to generate radiation.

If the assembly of FIG. 4 is rotated until the flange 44 and its window 45 are at the top of the assembly, and the assembly is used as a radiation source in the manner described above (that is, by applying a high voltage difference across flanges 44 and 48), a larger fraction of the X-ray photons that are generated by positive powder particles just below window 45 are transmitted through window 45.

If the electrode comprising flanges 42 and 44 (and hence window 45) are to be used as an anode, so that this composite electrode becomes an X-ray target, the window 45 must carry a thin film of the appropriate X-ray target element on its interior surface. In this situation, the beryllium window 45 becomes a "transmission target". Such a window can be prepared by depositing a few micrometres of the target element on a thin beryllium foil before the window 45 is formed. The beryllium provides the necessary mechanical strength for the window and enables a vacuum-tight joint 46 to be formed. If the thin film that is deposited on the beryllium foil is a good cold electron emitter, the coated window 45 can also be used as a cold cathode when the powder particles are positive.

Figure 5:
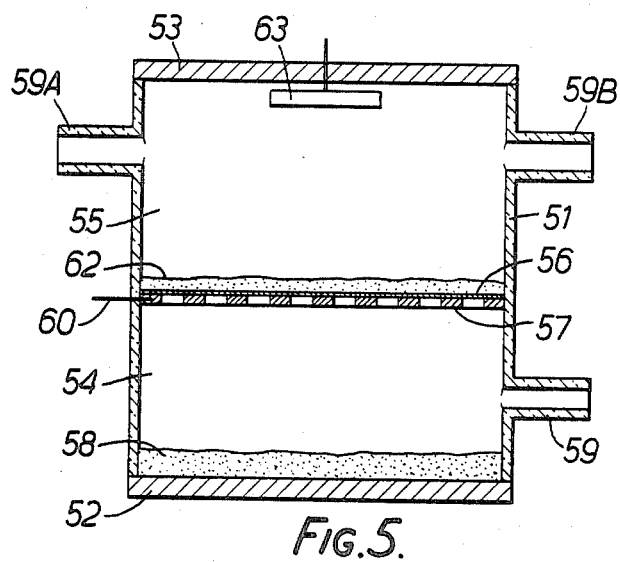
FIG. 5 illustrates apparatus for irradiating fluid material (for example, gases aerosols or dispersed solids) using radiation generated by a source which is constructed in accordance with the present invention.

FIG. 5 shows how the radiation source of the present invention can be used to provide an effective and economical device for irradiating fluids or powders capable of being electro-dispersed—such as a powder to be irradiated and used as an electro-dispersion cell.

The apparatus illustrated in FIG. 5 comprises an insulating cylinder 51 which is closed by metal ends 52 and 53. The cylinder 51 is divided into compartments 54 and 55 by a thin metal foil 56 which is supported on one side of a metal grid, mesh or perforated plate 57, which also extends across the cylinder 51. The lower compartment 54 contains some conducting powder 58 and is evacuated by connecting a vacuum pump to arm 59 which is joined to the wall of compartment 54. The upper compartment 55 is provided with a fluid inlet 59A and a fluid outlet 59B. The inlet 59A and outlet 59B may also be used to evacuate or reduce the pressure in the upper compartment 55. The foil 56 is connected to an external terminal 60.

By applying a sufficient voltage difference across electrode 52 and (via terminal 60) the foil 56, the powder 58 forms a dispersed cloud in compartment 54 and generates X-rays, as explained above. The X-rays are transmitted through the foil 56 and into the upper compartment 55. Any material present in compartment 55 is then irradiated with the X-rays that are generated in compartment 54. A radiation detector 63, mounted within compartment 55 near electrode 53, enables the radiation introduced into compartment 55 to be monitored.

As an example of the use of the embodiment of FIG. 5, a small quantity of powder 62 may be placed in the upper compartment 55. If the upper compartment 55 is then evavcuated and a suitable voltage difference is applied across the foil 56 and the electrode 53, the powder 62 will then be dispersed as a cloud in compartment 55 (it need not generate X-radiation). The dispersed cloud of particles in compartment 55 are thus irradiated with the X-radiation generated in compartment 54.

The apparatus illustrated in FIG. 5 is particularly useful because it enables the radiation source and the irradiated material to be adjacent to each other, thus satisfying the requirement for optimum irradiation of a sample, namely a minimum source/sample spacing.

In all of the applications of the present invention, there are some limitations on the operation of the radiation source. These limitations involve the pressure within the equipment at which the powder will disperse, and the material of the powder.

The pressure within tube 12 of FIG. 1 must be such that an electrostatic dispersion of the powder particles on anode 10 is achieved and maintained when a DC voltage difference which is suitable for producing the desired radiation is established between the upper and lower electrodes. The pressure must also be low enough to produce the desired radiation. This means that the pressure must be about $10^{-5}$ Torr or lower for an electrostatic dispersion to be satisfactorily maintained and for radiation also to be produced. The reason for the failure of the powder to disperse at lesser vacuum is believed to be due to an increased tendency for corona discharges in the gas in this pressure range. Corona discharges produce ions from the gas molecules, and those ions can effectively short-circuit the electrostatic field established between the anode and the cathode.

Those skilled in low pressure technology will be aware that the reduced pressures that can be maintained in the closed vessel depend to a large extent on the degree of out-gassing of all components of and within the evacuated vessel. In the circumstances of the present invention, the establishment of a sealed, easily evacuated radiation-emitting system is a problem that must be faced. The problem does not prevent the establishment of a sealed system, but the difficulty of out-gassing fine powders having surface areas in the range from 300 to 400 square metres per kilogram means that the appropriate equipment and techniques must be adopted to establish the required vacuum.

The selection of the material of the powder that can be dispersed is limited to metals, semi-conductors (including carbon), and selected other materials. In general, powders of electrically insulating materials are non-dispersive in vacua.

Particles of any electrically insulating material, however, will become dispersive in vacua if they are coated with a thin film of conductive material (for example, by the technique described in the specification of aforementioned Australian Patent Application No. 69790/81).

It has already been noted the present invention becomes a light source if phosphors (that is, materials which emit light when excited by X-radiation or by electrons) are used. X-ray excited phosphors in the form of dispersible particles, such as activated zinc sulphide particles, may be admixed with dispersible particles which generate X-radiation. The X-rays then cause the phosphor particles to produce light. Electron-excited phosphors (such as activated halophosphates in the form of dispersible particles) will emit light when they are subjected to field-emitted electrons arising from the cold cathode. Clearly, part or all of the evacuated enclosure must be made of a material transparent to the light produced, such as glass or silica.

Other modifications of the present invention are, of course, possible, without departing from the present inventive concept.

INDUSTRIAL APPLICABILITY

The present invention provides low cost X-ray sources which are readily constructed and easy and economical to operate. These sources can be produced in a range of shapes and sizes. Their maximum output intensities are substantially higher than those of typical, commercially-available radioisotope X-ray sources and are not less than the output of conventional 100 watt X-ray tubes. They offer a very wide choice of radiation energies because, unlike conventional sources, they permit the use of many different X-ray target elements and materials, either singly or in various combinations. They can also be made to emit narrow, broad, or broad and rectilinear, radiation beams.

The uses to which the present invention can be put will depend on which aspect of the source is being exploited. For example, as an X-ray source, the present invention can be used for all industrial applications for which conventional X-ray sources of comparable output have been used. These include radiogauging and several types of X-ray analysis, including XRF. Indeed, the present invention can be used in applications for which conventional X-ray sources are too costly or have an inadequate output (for example, applications requiring an intensity of X-radiation which is greater than that which can be obtained from radioisotope sources and less than the nominal output of an X-ray tube).

The close correlation between radiation output and powder material permit the present invention to be used to check the composition of samples of batches of powders (by observing the energy spectrum of the emitted X-radiation), or the composition of phosphors (by observing variations in light outputs of samples included in a powder).

The present invention can also be used for broad beam irradiation of materials which occupy extended areas or volumes, and for X-ray emission analysis. X-ray emission analysis has previously been possible only for microscopic sample regions which are irradiated by electron beams (for example, in instruments such as electron microprobes). With the present invention, X-ray emission analysis of bulk samples up to about 10 g is possible.

When used in the embodiment illustrated in FIG. 5, the present invention is suitable for (a) irradiation of solids which have been dispersed in a vacuum or in a gas to effect radiation-catalysed chemical reactions;

(b) determining the solids content of aerosols by radiation attenuation and scatter measurements; and (c) XRF (X-ray fluorescence) analysis of powdered samples.

This summary of the uses to which the present invention may be put is not intended to be exhaustive.

We claim:

1. A method of generating X-radiation from an apparatus comprised of:
   (a) at least two electrodes mounted in an evacuable chamber with one of the electrodes positioned above the other electrode;
   (b) a quantity of a powder of at least one conducting or semi-conducting material supported on the lower of said electrodes when said electrodes have a potential difference that is less than a value of the potential difference which produces a minimum dispersing field for said powder; and
   (c) means permitting a transmission of radiation from a region between the electrodes to outside of said chamber; said method comprising the steps of:
      (i) evacuating said chamber to a pressure of $10^{-5}$ Torr or lower, and
      (ii) applying to said electrodes a potential difference which has a value in excess of the value which produces the minimum dispersing field for the powder; thus dispersing at least some of said powder between said electrodes and generating X-radiation within said chamber, said X-radiation being transmitted through said means permitting the transmission of radiation.

2. A method as defined in claim 1 in which the lower electrode has a substantially planar upper surface.

3. A method as defined in claim 1 in which the lower electrode has a dished upper surface.

4. A method as defined in claim 1, claim 2 or claim 22 in which said electrodes are mounted within a cylinder that is positioned in said chamber, at least part of said cylinder being transparent to the radiation produced by the powder when said chamber and said cylinder are evacuated to a pressure which is $10^{-5}$ Torr or lower and a voltage difference is applied across said electrodes to disperse at least some of the powder supported on the lower electrode into the space between said electrodes.

5. A method as defined in claim 1 in which said chamber is a glass container having an open top and a glass base, said upper electrode comprises a metal plate which closes the top of said container, and said lower electrode is a metal plate adjacent to and covering the base of said container.

6. A method of generating X-radiation from an apparatus comprised of:
   (a) a chamber comprising a ceramic or glass cylinder having a vertical axis and being closed by metal electrodes at each end of said cylinder, said metal electrodes forming vacuum-tight seals with the ends of said cylinder;

(b) a quantity of powder of at least one conducting or semi-conducting material within said chamber;
(c) means for evacuation of said chamber;
(d) means to apply a high voltage difference to said electrodes; and
(e) means permitting radiation to be transmitted from said chamber; said method comprising the steps of:
  (i) evacuating said chamber to a pressure of $10^{-5}$ Torr or lower and
  (ii) applying to said electrodes a potential difference which has a value in excess of a value which produces a minimum dispersing field for the powder, thus dispersing at least some of said powder between said electrodes and generating X-radiation within said chamber, said X-radiation being transmitted through said means permitting radiation to be transmitted.

7. A method as defined in claim 1 or claim 6, in which said apparatus includes a phosphor which is positioned for irradiation by the X-radiation produced within said chamber.

8. A method as defined in claim 1 or claim 6 in which a phosphor is included within said chamber for irradiation by the X-radiation produced therein.

9. A method as defined in claim 1 or 6 in which said powder includes particles of at least one cathodoluminescent phosphor.

10. A method as defined in claim 1 or 6 in which said means for permitting the transmission of radiation comprises at least one radiation window in said chamber.

11. A method as defined in claim 1 or 6 in which said upper electrode is a cathode, including the step of heating the cathode to augment field emission of electrons therefrom.

12. A method as defined in claim 1 or 6 including the step of controlling the output of said X-radiation by varying the potential difference applied to said electrodes.

13. An X-radiation source comprising:
(a) at least two electrodes mounted in an evacuable chamber with one of the electrodes positioned above the other electrode;
(b) means to evacuate said chamber;
(c) means to apply a high voltage difference to said electrodes;
(d) a quantity of a powder of at least one conducting or semi-conducting material supported on the lower of said electrodes when the electrodes have a potential difference that is less than a value of potential difference which produces a minimum dispersing field for said powder;
(e) a means permitting transmission of radiation from a region between the electrodes to outside of said chamber; and
(f) a phosphor positioned for irradiation by the X-radiation which is produced by the source when the chamber is evacuated to a pressure of $10^{-5}$ Torr or lower and a voltage difference which has a value in excess of the value required to establish the minimum dispersing field for the powder is applied across said electrodes.

14. A radiation source as defined in claim 13 in which said phosphor is located within said chamber.

15. A radiation source, as defined in claim 13 in which said phosphor comprises particles of at least one cathodoluminescent phosphor included within said powder.

16. A radiation source as defined in claim 13 in which said means for permitting the transmission of radiation comprises at least one radiation window in said chamber.

17. A radiation source as defined in claim 13 in which said chamber is a cylindrical chamber having a substantially vertical axis and said at least one radiation window is an elongate, substantially horizontal window which extends around said cylindrical chamber.

18. A radiation source as defined in claim 13 wherein said chamber comprises a ceramic or glass cylinder having a vertical axis and being closed at each end by metal electrodes which are a vacuum-tight seal with the ends of said cylinder, and a single radiation window is formed in one of said metal electrodes.

19. A radiation source as defined in claim 13 in which the upper of said electrodes is a cathode, including means to heat said cathode to augment field emission of electrons therefrom.

20. A radiation source as defined in claim 13 including a high voltage DC supply connected across said electrodes.

21. A radiation source as defined in claim 20 including means to apply an AC ripple voltage to said high voltage DC supply.

22. A radiation source as defined in claim 13 including an auxilliary electrode within said chamber.

23. An X-radiation source comprising:
(a) a vertically mounted cylinder of insulating material, said cylinder being closed at its upper and lower ends by respective electrically conductive metal closures and being divided into an upper compartment and lower compartment by a thin metallic sheet which is supported on a metal grid, mesh or perforated plate; outlet means in the lower compartment being connected to a vacuum pump which maintains the lower compartment at a pressure of $10^{-5}$ Torr or lower; fluid inlet and fluid outlet means being provided in the upper compartment to enable fluid to pass therethrough;
(b) a terminal connected to said thin metallic sheet;
(c) means for applying a high voltage difference between said terminal and the lower one of said metal closures; and
(d) a quantity of powder of a conducting or semi-conducting material within said lower compartment on the lower of said metal closures; at least part of said powder being dispersed within said lower compartment by application across said terminal and said lower metal closure of a voltage difference which is sufficient to produce at least a minimum dispersing field for the powder; X-radiation thus being generated within said lower compartment and being transmitted into said upper compartment through gaps in said grid, mesh or perforated plate and through said thin metallic sheet.

24. An X-radiation source as defined in claim 23 including a quantity of a second powder of a conducting or semiconducting material within said upper compartment on said thin metallic sheet; said fluid inlet means being closed and said fluid outlet means being connected to a vacuum pump which maintains the upper compartment at a pressure of $10^{-5}$ Torr or lower; a second voltage difference being applied across said terminal and the upper metal closure to cause said second powder to be dispersed within said upper compartment; said second powder being thus irradiated by the X-radiation generated in the lower compartment and passing through the gaps in said grid, mesh or perforated plate and through said thin metallic sheet.

25. A radiation source as defined in claim 23 or claim 24 including a radiation detector in said upper compartment.

* * * * *